United States Patent [19]

King et al.

[11] 4,323,799
[45] Apr. 6, 1982

[54] IMPULSE ACTIVATED TIME DELAY SELF-RESTORING SWITCH

[75] Inventors: William C. King, Chatham Township, Morris County; Stephen Knight, Murray Hill, both of N.J.

[73] Assignee: Bell Telephone Laboratories, Incorporated, Murray Hill, N.J.

[21] Appl. No.: 65,184

[22] Filed: Aug. 9, 1979

[51] Int. Cl.³ .................. H03K 17/687; H03K 17/94
[52] U.S. Cl. .................... 307/571; 307/311; 307/594; 307/597; 179/175.3 F
[58] Field of Search ............ 307/251, 257, 259, 293, 307/311, 571, 577, 581, 580, 594, 597; 179/175.3 R, 175.3 A, 175.3 F

[56] References Cited

U.S. PATENT DOCUMENTS

| | | | |
|---|---|---|---|
| 3,860,769 | 1/1975 | PacHynski, Jr. | 179/175.3 R |
| 3,867,588 | 2/1975 | Pickens et al. | 179/175.3 R |
| 3,935,481 | 1/1976 | Uchikawa | 307/251 |
| 4,054,759 | 10/1977 | McGrath et al. | 179/175.3 R |
| 4,227,098 | 10/1980 | Brown et al. | 307/311 |

OTHER PUBLICATIONS

R. L. Peek, Jr. "Principles of Slow Release Relay Design", The Bell System Technical Journal, Jan., 1954, pp. 187–217.

Primary Examiner—John Zazworsky
Attorney, Agent, or Firm—Richard D. Laumann

[57] ABSTRACT

An impulse activated switch having a controlled time-delayed self-restoration from its complementary state to its initial state is described. Upon illumination, a photo-diode array connected to the gate and source electrodes of a field effect transistor produces a voltage which changes the current conduction state of the field effect transistor to its complementary state and charges a capacitance. The capacitance forms part of an RC timing network which controls the time required for self-restoration. The switch may be normally on or off and unilateral or bilateral.

13 Claims, 3 Drawing Figures

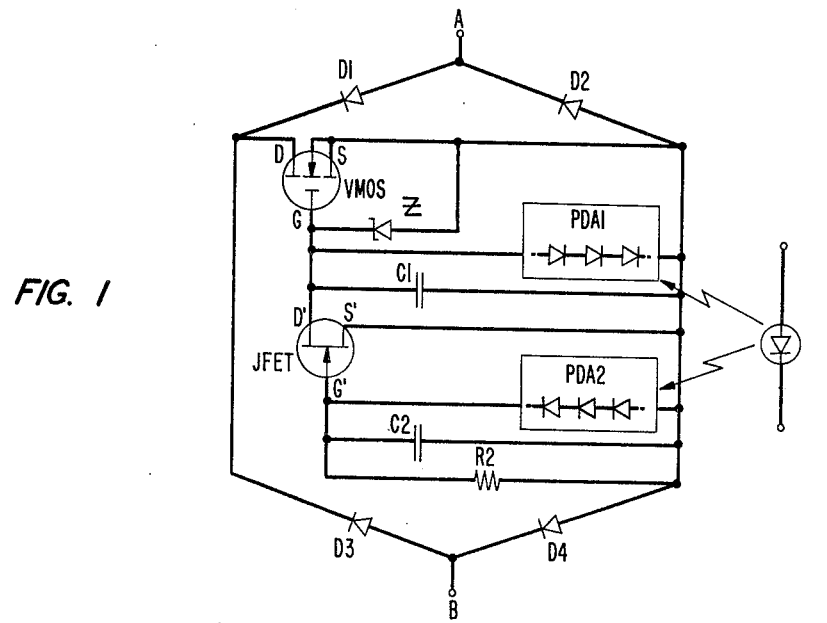

IMPULSE ACTIVATED TIME DELAY SELF-RESTORING SWITCH

TECHNICAL FIELD

This invention is concerned generally with time delay switches and particularly with impulse activated time delay self-restoring switches.

BACKGROUND OF THE INVENTION

Time delay switches, which may delay either the change from the initial state to the complementary state or vice versa, are important in many electronic circuit applications. For example, this type of switch is useful in the telephone industry, because it permits a central office to disconnect subscriber equipment and test the lines between the central office and subscriber. Such switches provide a time delay between a control signal and the actual operation of the switch which, depending upon the type of switch, will be the change to or return from the complementary state. The latter is commonly called a slow release relay. The time delay assures a specified sequence of circuit operation and permits, for example, testing circuits for faults from a central location. To simplify the circuit operation, the switch should have constant, although different, impedances in both the initial and complementary states.

Several approaches have been taken in designing the slow release type of time delay switches. The use of electromechanical relays in such switches is well known. An article by R. L. Peck, Jr., *Bell System Technical Journal*, 33, 187–217 (1954), discusses relevant design considerations for a particular type of slow release relay.

Various types of time delay control are in common use. For example, bimetallic strips, air dashpots and solid state hybrids have been used in time delay relays. The latter approach is attractive because it affords possibilities of high reliability, small size and low cost because of its solid state timing function. However, it still requires a relay for the switching function. For many uses, the bulk and weight of this type of switch are drawbacks and alternatives which do not use electromechanical relays have been sought. Optical activation is a desirable feature because it does not compromise attainment of the desired characteristics while affording complete electrical isolation between circuits.

SUMMARY OF THE INVENTION

We have found that in an impulse activated switch with essentially constant, although different, impedances in the initial and complementary states, a time-delayed self-restoration from the complementary state to the initial state may be constructed. The switch uses a field effect transistor (FET) which is changed from its initial to complementary current conduction state by the voltage produced by an illuminated series connected photodiode array connected between the FET gate and source. The photodiode array charges a capacitance and the switch returns to its initial state after a controlled time interval determined by discharge of the capacitance through an RC timing network. The light illuminating the photodiode array is typically from an LED connected to an electrical input circuit.

In a first preferred embodiment, a normally off switch uses a photovoltaically controlled depletion mode field effect transistor connected between the gate and source of a second photovoltaically controlled field effect transistor to control the second field effect transistor. The drain-source impedance of the photovoltaically controlled depletion mode field effect transistor provides a large and constant resistance in the RC timing network for a period of time after the array is illuminated. The switch has an essentially constant impedance for a period of time corresponding to the time required for the discharge of the capacitance between the depletion mode FET's gate and source from the photodiode array voltage to the pinch-off voltage.

A switch with this type of time-delayed restoration to the initial state appears especially useful when the second photovoltaically controlled FET is a normally off enhancement mode MOSFET such as a vertical metal oxide semiconductor (VMOS) field effect transistor.

In a second preferred embodiment, a normally on switch uses a depletion mode FET as the field effect transistor which is switched and the RC timing network controlling the return to the initial state from the complementary state is provided by a capacitance and resistance connected in parallel between the gate and source electrodes of the FET.

In a third embodiment, bilateral versions of the first and second embodiments are used to form a triple pole single throw switch, which upon simultaneous activation of the individual switches, disconnects a telephone unit located at the customer premises from the telephone lines between the telephone unit and a central office and connects a dummy ringer across the telephone lines.

BRIEF DESCRIPTION OF THE DRAWING

FIG. 1 is a schematic representation of an impulse activated normally off bilateral self-restoring switch with time delay provided by a timing network;

FIG. 2 is a schematic representation of an impulse activated normally on bilateral self-restoring FET switch; and FIG. 3 is a schematic representation of a triple pole single throw device containing both normally off and normally on bilateral impulse activated time-delayed self-restoring switches.

DETAILED DESCRIPTION

A switch of this invention having controlled time delayed self-restoration to its initial state from its complementary state after impulse activation is represented schematically in FIG. 1. This switch is a normally off switch. Between output terminals A and B, diodes D1, D2, D3 and D4 form a bridge across a first field effect transistor having drain, gate and source electrodes, represented by D, G and S, respectively. Electrodes D and S are connected to the junctions of D1 with D3 and D2 with D4, respectively. The first FET is an enhancement mode vertical metal oxide semiconductor (VMOS) field effect transistor. A zener diode, Z, is connected between VMOS electrodes G and S. A series connected photodiode array, PDA1, and capacitance represented by C1, and a depletion mode second field effect transistor, represented by JFET and having electrodes D', G' and S', are connected in parallel between electrodes G and S. A depletion mode MOS device could also be used. Capacitance C1 and the drain-source resistance of the JFET form the RC timing network for the first FET. A second series connected photodiode array, represented by PDA2, is connected in between G' and S'. Electrodes D' and S' are connected to electrodes G and S, respectively. A parallel connected RC circuit having a second capacitance, represented by C2, and a resistance, represented by R2, is connected between G' and S'. A light source is connected to an input circuit. It is to be understood that "light," as used in this specification, means electromagnetic radiation in the visible and infrared regions, i.e., electromagnetic radiation having wavelengths between approximately 0.4 microns and 2 microns.

Although the photodiode arrays are depicted with three photodiodes, this is for purposes of illustration only and the arrays used will have a number of diodes sufficient to alter the current conduction state of the FET. It is to be understood that the embodiment depicted in FIG. 1 is illustrative only and the elements depicted may be deleted or modified in such a manner as will be described below and in ways that are obvious to those persons having ordinary skill in the art.

The operation of this embodiment, which is a bilateral time delay self-restoring switch, will be described before specific contemplated modifications are described. When illuminated, PDA1 develops the gate-source voltage sufficient to change the enhancement mode VMOS device depicted from its nonconducting or off state to its complementary conducting state and capacitance C1 is charged to this voltage. The bridge circuit formed by the four diodes permits bilateral operation of the switch. When terminal A is positive with respect to terminal B, an electrically conducting path from A to B is formed through D1, the FET (drain to source) and D4. When terminal B is positive with respect to terminal A, an electrically conducting path from B to A is formed through D3, the FET (drain or source) and D2. When the FET is off, the bridge provides blocking for either polarity since the drain is always positive with respect to the source. Upon simultaneous illumination, PDA2 generates a voltage on capacitance C2 that is greater than the pinch-off voltage of the JFET or second FET and changes the normally on JFET from its initial conducting state to its complementary off or high impedance state. When the illumination of PDA1 and PDA2 is simultaneously terminated, the second FET now forms an extremely high impedance path through which the capacitance C1 must discharge, with an extremely long time constant, before the VMOS can return to its normally off state. Meanwhile, C2 discharges through R2 and when it is discharged, with its controlled R2C2 time constant, to a voltage less than the JFET pinch-off voltage, the JFET drain-source impedance decreases rapidly and permits capacitance C1 to discharge rapidly. At this point, the VMOS returns rapidly to its initial state.

In a typical configuration, R2 has a value of 22 megohms and C1 and C2 both have a value of 0.5 microfarads. Upon illumination by an LED input signal of 50 mA and 100 msec, the switch (terminals A-B) remains on for approximately 10 seconds before reverting to the off state in an additional time, called the reversion time, of approximately 3 seconds. The on time and the reversion time may be varied in well-known manner by varying values of the circuit components.

The switch schematically represented in FIG. 1 may be modified to obtain configurations with other characteristics. For example, the diode bridge permits bilateral operation of the switch. If symmetry with respect to the polarity of the voltage is not desired or required, as it will not be for many uses, the diode bridge may be omitted and a unilateral switch obtained. In the resulting configuration, output terminals A and B are connected directly to the drain and source, respectively, of the first field effect transistor. The zener diode, which protects against static charge damage to the FET, may be omitted if it is believed static charges will not constitute a serious problem. The FET may be fabricated with the zener diode forming an integral part.

A second switch of this invention having controlled time delayed self-restoration to its initial state from its complementary state is illustrated schematically in FIG. 2. A light source, such as a light emitting diode (LED), is connected to an electrical input circuit. The output circuit has an n-channel depletion mode junction field effect transistor (JFET) having drain, gate and source electrodes represented by D, G and S, respectively. A depletion mode MOS device could be used. The drain and source electrodes are connected to output circuit terminals A and B through the diode bridge formed by diodes D5, D6, D7 and D8. A series connected photodiode array (PDA), a capacitance, C, and a resistance, R, are connected in parallel between the gate and source electrodes of the FET. The capacitance and resistance form the RC timing network. In a typical configuration, R and C have values of 22 megohms and 0.7 microfarads, respectively.

When activated by an electrical impulse signal, the LED emits light which illuminates the PDA. The PDA has a sufficient number of series connected photodiodes so that upon illumination the voltage produced exceeds the FET pinch-off voltage. It is crucial for the time delayed self-restoration operation that the PDA voltage exceed the pinch-off voltage. As a result, the normally on FET no longer conducts current and the switch is changed to its complementary state. The capacitance, which has been charged to the photodiode array voltage, discharges at a rate determined by the time constant of the RC timing network and the FET again begins to conduct current when the voltage on the capacitance drops below the pinch-off voltage.

An LED pulse of 50 mA and 100 msec duration turned off the FET for approximately 8 seconds and self-restoration to the on state occurred within 20 seconds of impulse activation.

The time required for such a return is determined by several factors. It may be increased by increasing either the voltage produced by the photodiode array or the time constant of the RC timing network. It has been found most satisfactory to increase the size of the capacitance. The switch has an essentially constant off state impedance for as long as the voltage on the capacitance remains greater than the pinch-off voltage of the JFET.

Although a bilateral switch is illustrated in FIG. 2, it is to be understood that other bilateral FET switches, as well as a unilateral switch, having a PDA and RC timing network are also contemplated. As an example of another bilateral version of the embodiment of FIG. 2, a second RC timing network and a second PDA are symmetrically connected between the drain and gate electrodes, i.e., the second RC timing network and the second PDA are connected in a mirror image with respect to the first network and PDA. In other words, the cathode terminating the first PDA is connected to the cathode terminating the second PDA. The diode bridge is not used. Two blocking diodes must be used. The anode of the first blocking diode is connected to the terminating anode of the first PDA, and the cathode of the first blocking diode is connecting to the source electrode. The anode of the second blocking diode is connected to the terminating anode of the second PDA, and the cathode of the second blocking diode is connected to the drain electrode. The elements of the RC timing networks may be connected to the blocking diode cathode, anode, etc. The blocking diodes restrict the current conduction through paths other than the desired path formed by the drain-source channel of the FET. If the diode is between the anode of the PDA and C, some shunt conduction through R may be present, but the current will be small if R is large. A unilateral version of the switch in FIG. 2 may be obtained by not using the diode bridge.

Switches using the blocking diodes have linear characteristics through the origin of the current-voltage curves, while switches with a diode bridge have a voltage offset at the origin.

A third embodiment of this invention is a triple pole single throw switch having time delayed self-restoration to its initial state. Such a device is schematically represented in FIG. 3. Switches 1 and 2 are impulse activated and normally on bilateral switches with a time-delayed self-restoration to their initial states and form optically activated means for disconnecting telephone station apparatus from the T and R lines. Bilateral embodiments of the switch depicted schematically in and described with respect to FIG. 2 may be used. Switch 3 is a normally off, impulse activated, time delay self-restoring bilateral switch such as depicted in and described with respect to FIG. 1, and forms optically activated means for connecting an impedance across and T and R lines. DR represents a dummy ringer, in series with switch 3, connected across the lines, called tip and ring and represented by T and R, respectively, between the central office and the customer premises. Dummy ringer and switch 3 are each connected to an input terminal. Switches 1, 2 and 3 together with the dummy ringer may be referred to collectively as a maintenance termination unit (MTU). Switches 1 and 2 are desirably linear and bilateral to handle analog signals. The dummy ringer is equivalent to a telephone ringing impedance. Telephone station apparatus located on customer premises is represented by a telephone handset, although it is contemplated that other equipment might be present, and is connected in series, through two output terminals on the MTU, to the MTU. CO represents a central office which is connected remotely to two input terminals on the maintenance termination unit via tip and ring lines represented by T and R, respectively.

Upon impulse activation from the central office, switches 1 and 2 change from their normally on (conducting) initial states to their complementary off (nonconducting) states, and switch 3 changes from its normally off initial state to its complementary on state. As a result of these changes, the telephone station apparatus is disconnected from the tip and ring lines and the dummy ringer is connected across the tip and ring lines. Tests may now be performed from the central office to determine the status or condition of the tip or ring lines. Upon impulse activation, the switches change from their initial states to their complementary states in a fraction of a second and maintain those states for an adjustable and controlled period of time, without any further application of a control signal, and then return to their normal states via self-restoration. This allows tests to be performed in the "dry" state. That is, there is no need for an additional bias on either the T or R lines to hold the circuit in the test condition. While the circuit of FIG. 3 has been described in terms of a dummy ringer inserted in series with switch 3, it is to be understood that other known impedances could be used in place of the dummy ringer.

It will be recognized that the time required to change from the initial state to the complementary state depends upon the time required to charge the capacitance in the RC timing network and upon such well-known factors as the magnitude and duration of LED current, the efficiency of the optical coupling between the LED and the photodiode array, etc. It should also be recognized that the RC timing network need not be parallel connected with the photodiode array.

We claim:

1. An impulse activated time delay self-restoring switch comprising:
    a first field effect transistor (FET), said first transistor having source, gate and drain electrodes, said source and drain electrodes being connected to an electrical output circuit having first and second output terminals;
    a light source, said light source being connected to an electrical input circuit;
    a first series connected photodiode array, said array being optically coupled to said light source and connected to said field effect transistor whereby when said photodiode array is illuminated, said FET changes from an initial current conduction state to a complementary current conduction state; and
    means for time delayed self-restoration from said complementary state to said initial state, said means being connected to said gate and source electrodes; characterized in that said means comprises an RC timing network, said network comprising a parallel connected resistance and capacitance.

2. An impulse activated switch as recited in claim 1 in which said first photodiode array is connected to said gate and source electrodes of said first field effect transistor.

3. An impulse activated switch as recited in claim 2 in which said resistance comprises a depletion mode second field effect transistor, said second transistor having source, gate and drain electrodes, said drain and source electrodes being connected to said gate and source electrodes of said first field effect transistor;
    a second series connected photodiode array, said array being connected between said gate and source electrodes of said second field effect transistor, said second photodiode array being optically coupled to said light source; and a parallel connected resistance and capacitance connected in parallel to said second photodiode array.

4. An impulse activated time delay switch as recited in claim 3 in which said first transistor is an enhancement mode FET.

5. An impulse activated time delay switch as recited in claim 4 in which said FET is a VMOSFET.

6. An impulse activated time delay switch as recited in claim 2, 3 or 4 further comprising first and second diodes connected between said drain and source electrodes and a first output terminal and third and fourth diodes connected between said drain and source electrodes and said second output terminal whereby said diodes form a bridge permitting bilateral operation.

7. An impulse activated time delay switch as recited in claim 6 further comprising a zener diode connected between said gate and source electrodes of said first transistor.

8. An impulse activated time delay switch as recited in claim 1 or 2 further comprising a second series connected photodiode array, said array being connected between said gate and drain electrodes and optically coupled to said light source; and said means for time delayed self-restoration further comprises a second RC timing network comprising a second parallel connected resistance and capacitance, said second network being connected to said gate and drain electrodes of said first field effect transistor; and first and second blocking diodes, said first and second diodes being series connected between said first and said second photodiode array and said source and drain electrodes, respectively.

9. A switch for disconnecting telephone station apparatus from tip and ring lines comprising first optically activated means for disconnecting telephone station apparatus from said tip and ring lines;

an impedance; and second optically activated means for connecting said impedance across said tip and ring lines in which said optically activated means for connecting comprises a first field effect transistor (FET), said first transistor having source, gate and drain electrodes, said source and drain electrodes being connected to an electrical output circuit having first and second output terminals; a first terminal being connected to said impedance; a second terminal adapted to being connected to said tip or said ring line;

a light source, said light source being connected to an electrical input circuit;

a first series connected photodiode array, said array being connected to said gate and source electrodes of said first field effect transistor and optically coupled to said light source and connected to said field effect transistor whereby when said photodiode array is illuminated, said FET changes from an initial current conduction state to a complementary current conduction state; and an RC timing network comprising a parallel connected resistance and capacitance for time delayed self-restoration from said complementary state to said initial state, said means being connected to said gate and source electrodes.

10. A switch as recited in claim 9 in which said resistance comprises a depletion mode second field effect transistor, said second transistor having source, gate and drain electrodes, said drain and source electrodes being connected to said gate and source electrodes of said first field effect transistor; and a second series connected photodiode array, said array being connected between said gate and source electrodes of said second field effect transistor, said second photodiode array being optically coupled to said light source; and a parallel connected resistance and capacitance connected in parallel to said second photodiode array.

11. A switch as recited in claims 9 or 10 in which said optically activated means for disconnecting comprises a third field effect transistor (FET), said third transistor having source, gate and drain electrodes, said source and drain electrodes being connected to an electrical output circuit having third and fourth output terminals; a third terminal being connected to said first or second terminal; and a fourth terminal adapted to being connected to said tip or said ring line;

a light source, said light source being connected to an electrical input circuit;

a third series connected photodiode array, said array being connected to said gate and source electrodes of said third field effect transistor and optically coupled to said light source and connected to said third field effect transistor whereby when said photodiode array is illuminated, said third FET changes from an initial current conduction state to a complementary current conduction second state;

a second RC timing network comprising a parallel connected resistance and capacitance for time delayed self-restoration from said complementary state to said initial state, said means being connected to said gate and source electrodes;

a fourth series connected photodiode array, said array being connected between said gate and drain electrodes of said third field effect transistor and optically coupled to said light source;

a third RC timing network comprising a second parallel connected resistance and capacitance, said second network being connected to said gate and drain electrodes of said third field effect transistor; and first and second blocking diodes, said first and second diodes being series connected between said third and said fourth photodiode array and said source and drain electrodes, respectively.

12. A switch as recited in claims 9 or 10 in which said optically activated means for disconnecting comprises a third field effect transistor (FET), said third transistor having source, gate and drain electrodes, said source and drain electrodes being connected to an electrical output circuit having third and fourth output terminals; a third terminal being connected to said first or second terminal; and a fourth terminal adapted to being connected to said tip or said ring line;

a light source, said light source being connected to an electrical input circuit;

a third series connected photodiode array, said array being connected to said gate and source electrodes of said third field effect transistor and optically coupled to said light source and connected to said third field effect transistor whereby when said photodiode array is illuminated, said third FET changes from an initial current conduction state to a complementary current conduction second state;

a third RC timing network comprising a second parallel connected resistance and capacitance, said second network being connected to said gate and drain electrodes of said third field effect transistor; and first and second diodes connected between said drain and source electrodes and a third output terminal and third and fourth diodes connected between said drain and source electrodes and said fourth output terminal whereby said diodes form a bridge permitting bilateral operation.

13. A switch as recited in claim 11 in which said optically activated means for connecting and said impedance are series connected.

* * * * *

UNITED STATES PATENT AND TRADEMARK OFFICE
CERTIFICATE OF CORRECTION

PATENT NO. : 4,323,799

DATED : April 6, 1982

INVENTOR(S) : William C. King and Stephen Knight

It is certified that error appears in the above—identified patent and that said Letters Patent is hereby corrected as shown below:

Column 3, line 33, "or" should read --to--. Column 4, line 67, "connecting" should read --connected--. Column 5, line 31, "and", first occurrence, should read --the--.

Signed and Sealed this

Fifteenth Day of June 1982

[SEAL]

Attest:

GERALD J. MOSSINGHOFF

Attesting Officer  Commissioner of Patents and Trademarks